(12) United States Patent
Kim

(10) Patent No.: US 6,243,312 B1
(45) Date of Patent: Jun. 5, 2001

(54) SEMICONDUCTOR MEMORY DEVICE

(75) Inventor: Kang Yong Kim, Ichon (KR)

(73) Assignee: Hyundai Electronics Industries Co., Ltd., Ichon (KR)

( * ) Notice: Subject to any disclaimer, the term of this patent is extended or adjusted under 35 U.S.C. 154(b) by 0 days.

(21) Appl. No.: 09/472,872

(22) Filed: Dec. 28, 1999

(30) Foreign Application Priority Data

Dec. 28, 1998 (KR) .................................................. 98-59543

(51) Int. Cl.[7] .................................................... G11C 7/00
(52) U.S. Cl. .......................... 365/207; 365/203; 365/205; 365/191; 365/196; 365/204
(58) Field of Search ................................... 364/205, 207, 364/203, 191, 196, 204

(56) References Cited

U.S. PATENT DOCUMENTS

| 5,053,642 | * | 10/1991 | Ishihara et al. | 307/443 |
| 5,265,054 | * | 11/1993 | McClure | 365/200 |
| 5,305,268 | * | 4/1994 | McClure | 365/203 |
| 5,574,688 | * | 11/1996 | McClure et al. | 365/200 |
| 5,914,909 | * | 6/1999 | Park | 365/230.06 |
| 5,966,319 | * | 10/1999 | Sato | 365/154 |
| 6,160,733 | * | 12/1999 | Ebel | 365/154 |

* cited by examiner

Primary Examiner—Viet Q. Nguyen
(74) Attorney, Agent, or Firm—Jacobson, Price, Holman & Stern, PLLC

(57) ABSTRACT

A semiconductor memory device feeds back a signal made by detecting a data sensing when reading a memory chip, precharges a local data bus within a short time, performs a high-speed operation, and enhances a burst characteristic and AC characteristic responsive to the burst characteristic. The semiconductor memory device detects a sensing moment of a data generated from a local data bus in case of a read operation by using a data bus sense-amplifier unit. At this time, the detection signal precharges a local data bus and its related signals until the next data is generated.

8 Claims, 12 Drawing Sheets

SEMICONDUCTOR MEMORY DEVICE

BACKGROUND OF THE INVENTION

1. Field of the Invention

The present invention relates to a semiconductor memory device. More particularly, it relates to a semiconductor memory device which feeds back a signal made by detecting a data sensing when reading a memory chip, precharges a local data bus within a short time, performs a high-speed operation, and enhances a burst characteristic and AC characteristic responsive to the burst characteristic.

2. Description of the Prior Art

There is a burst read operation for making a high-speed operation in a synchronous dynamic random access memory (SDRAM) or a high-speed memory. If an external row active command and a read command are received, a data as many as a predetermined burst length (BL) is successively generated through a DQ pin according to an external clock. This is called a burst read operation.

For example, in case that a burst length BL is set to 4 as shown in FIG. 1 illustrating a timing diagram of a read operation in case of a burst length (BL)=4 and clock latency (CL)=2, four data are successively generated in response to an external clock by a read command. Here, a clock latency (CAS latency) of 2 means that a first data is generated after two clocks after a read command is received.

Such operation will be described with reference to FIG. 2.

FIG. 2 is a block diagram of a prior semiconductor memory device related to a data bus for a read operation.

Referring to FIG. 2, under a row active state, a column command and a clock signal (hereinafter referred to as E_CLK) internally made by an external clock are input to a CAS control unit 10.

A burst length counter unit 20 counts internal clocks I_CLK generated from the CAS control unit 10, and transmits enable signals BSC as many as a burst length BL to the CAS control unit 10, thereby generating internal clocks I_CLK as many as the burst length. Namely, in case of a burst length (BL)=4, four internal clocks are successively generated.

Two signals PYL and PRC are generated from a column precharge control unit 30 by the internal clock I_CLK.

A signal PYI is input to a column decoder unit 40, and thus makes a column decoder output signal Yi selecting a bit line sense-amplifier unit 50 along with a column address. The bit line sense-amplifier unit 50 including a cell data amplified by a row active command transmits the cell data to a local data bus when receiving the column decoder output signal Yi. The column decoder unit output signal Yi is generally generated as a pulse.

The data loaded on the local data bus is transmitted to the data bus sense-amplifier unit 70. At this time, once sensing operation is achieved, and thus the data is transmitted to a global data bus.

A signal PRC made by the internal clock I_CLK in the column precharge control unit 30 precharges a local data bus with a local data bus precharge voltage Vprc, and makes the data bus sense-amplifier 70 be at a precharge/standby state.

Before the column decoder unit output signal Yi opens the bit line sense-amplifier 50 toward the local data bus, the signal PRC prevents a precharge of the local data bus, and makes the data bus sense-amplifier unit 70 be at an active state.

After that, if the column decoder output signal Yi is enabled, the data is transmitted to the global data bus. If the column decoder unit output signal Yi is disabled, the bit line sense-amplifier unit 50 is closed, the signal PRC precharges the local data bus, and makes the data bus sense-amplifier unit 70 be at a precharge/standby state.

Herein, a column precharge control unit 30 adjusts each timing of the column decoder unit output signal Yi and the signal PRC by using the internal clock I_CLK. Accordingly, amplitudes of the column decoder unit output signal Yi and the signal PRC are determined in the column precharge control unit 30. In case of a burst read operation, an operation that a data as much as a burst length BL is loaded on the local data bus or is precharged is repeated.

FIG. 3 is a timing diagram of a signal and data in case of a read operation about a low clock frequency of FIG. 2; and FIG. 4 is a timing diagram of a signal and data in case of a read operation about a high clock frequency of FIG. 2. FIGS. 3-4 illustrate an example that data of another phase is successively loaded.

Let us suppose that a bit line sense-amplifier unit 50 is opened in case of a column decoder unit output signal Yi of a high state, and a precharge of a local data bus is prevented and a bus sense-amplifier unit 70 is activated in case of a signal PRC of a high state.

If the signal PRC and the column decoder unit output signal Yi are enabled as a high state, a local data is generated and thus a global data is generated from the data bus sense-amplifier unit 70.

In this case, there is no problem to read the data in case of a low clock frequency as shown in FIG. 3. That is, a read/precharge operation about one data and a read/precharge operation about the next data are normally performed. However, as a clock frequency becomes higher as shown in FIG. 4, the read/precharge operation about the data becomes difficult, thus a data read operation becomes impossible. The reason why the data read operation becomes impossible is that a time loss occurs in the signals Yi and PRC.

Although the local data is read by the signals PRC and Yi and the global data is generated from the data bus sense-amplifier unit 70, the signals Yi and PRC are disabled after a predetermined time irrespective of a clock frequency, so that the time loss occurs in a precharge operation. In other words, under the condition that a local data bus is not precharged, a previous data and an opposite phase data are not read in the local data bus.

As described above, in the aforementioned prior semiconductor memory device, a local data is read by the signal PRC and the column decoder unit output signal Yi which precharge a local data bus at a high clock frequency, the signals Yi and PRC are disabled after a predetermined time irrespective of a clock frequency. As a result, under the condition that the local data bus is not precharged, a previous data and an opposite phase data are not read in the local data bus.

SUMMARY OF THE INVENTION

Accordingly, the present invention is directed to a semiconductor memory device that substantially obviates one or more of the problems due to limitations and disadvantages of the related art.

It is an objective of the present invention to provide a semiconductor memory device which feeds back a signal made by detecting a data sensing when reading a memory chip, precharges a local data bus within a short time, performs a high-speed operation, and enhances a burst characteristic and AC characteristic responsive to the burst characteristic.

To achieve the above objective, in a semiconductor memory device which senses a data signal transmitted from a local data bus during a read operation by using a data bus sense-amplifier unit, and then outputs the data signal to a global data bus, a semiconductor memory device according to a preferred embodiment of the present invention includes: a data bus sense-amplifier output detector unit which is included in the data bus sense-amplifier, performs a logic operation about the data signal sensed by the data bus sense-amplifier unit, and generates a detection signal; and a column precharge control unit for generating a control signal to precharge the local data bus and the data bus sense-amplifier unit according to the detection signal from the data bus sense-amplifier output detector unit.

The data bus sense-amplifier output detector unit includes: a NOR gate for receiving an output signal of the data bus sense-amplifier unit as an input; and an inverter for outputting a control signal to the column precharge control unit according to an output signal of the NOR gate.

The data bus sense-amplifier output detector unit inputs a control signal into a column decoder unit, simultaneously with inputting a control signal into the column precharge control unit.

According to another preferred embodiment of the present invention, in a semiconductor memory device which senses a data signal transmitted from a local data bus during a read operation by using a data bus sense-amplifier unit, and then outputs the data signal to a global data bus, a semiconductor memory device according to another preferred embodiment of the present invention includes: a data bus sense-amplifier output detector unit which is included in the data bus sense-amplifier unit, performs a logic operation about the data signal sensed by the data bus sense-amplifier unit, and generates a detection signal; and a column precharge control unit for outputting a control signal to the data bus sense-amplifier unit according to the detection signal from the data bus sense-amplifier unit, wherein the detection signal is fed back to the local data bus and the data bus sense-amplifier unit as a precharge signal.

According to a still another preferred embodiment of the present invention, in a semiconductor memory device which senses a data signal transmitted from a local data bus during a read operation by using a data bus sense-amplifier unit, and then outputs the data signal to a global data bus, a semiconductor memory device according to a still another preferred embodiment of the present invention includes: a column precharge control unit for generating at least one control signal according to an internal clock; and a data bus sense-amplifier output detector unit included in the data bus sense-amplifier unit, which processes the data signal sensed and the control signal of the column precharge control unit by using a logic circuit, and generates a detection signal, wherein the detection signal of the data bus sense-amplifier output detector unit is fed back to the local data bus and the data bus sense-amplifier unit as a precharge signal.

Additional features and advantages of the invention will be set forth in the description which follows, and in part will be apparent from the description, or may be learned by practice of the invention. The objective and other advantages of the invention will be realized and attained by the structure particularly pointed out in the written description and claims hereof as well as the appended drawings.

It is to be understood that both the foregoing general description and the following detailed description are exemplary and explanatory and are intended to provide further explanation of the invention as claimed.

BRIEF DESCRIPTION OF THE DRAWINGS

Further objects and other advantages of the present invention will become apparent from the following description in conjunction with the attached drawings, in which.

DETAILED DESCRIPTION OF THE PREFERRED EMBODIMENTS

A preferred embodiment of the present invention will now be described in detail with reference to the accompanying drawings.

All drawings for explaining the preferred embodiments use the same number about the same function, so that an iterative explanation will be omitted.

Figure 5:
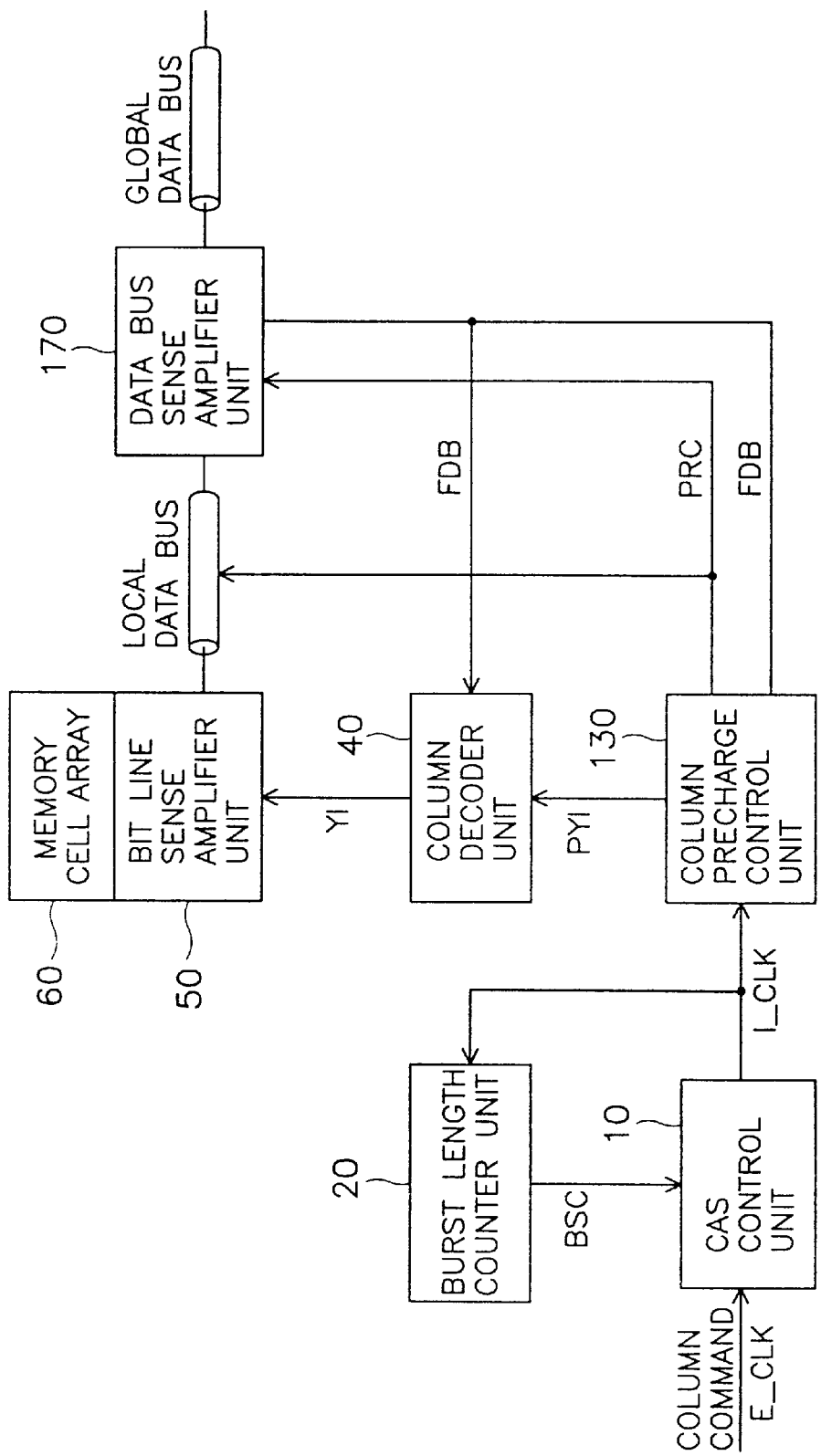
FIG. 5 is a block diagram of a semiconductor memory device related to a data bus for a read operation according to a first preferred embodiment of the present invention.
Figure 6:
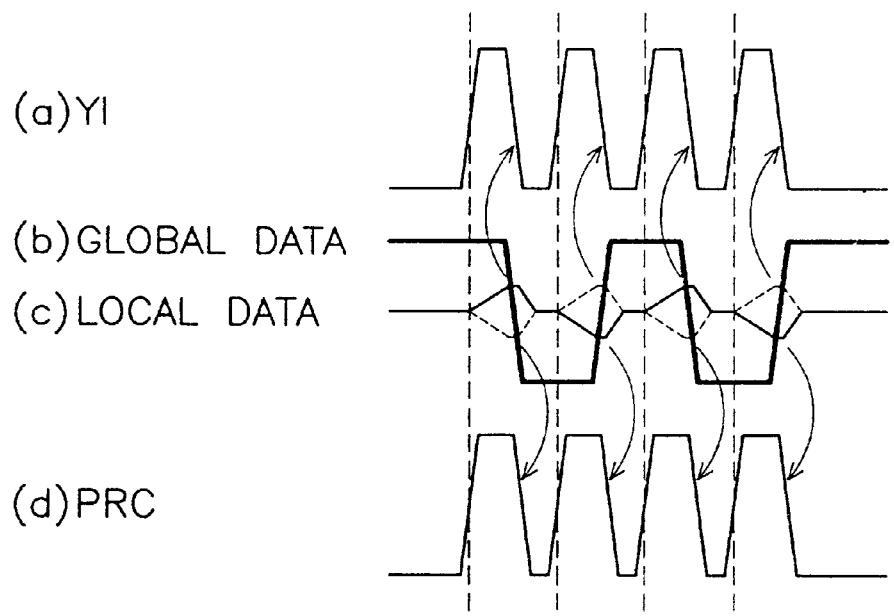
FIG. 6 is a timing diagram of a signal and data in case of a read operation about a high clock frequency of FIG. 5 according to a first preferred embodiment of the present invention.

FIG. 5 is a block diagram of a semiconductor memory device related to a data bus for a read operation according to a first preferred embodiment of the present invention; and FIG. 6 is a timing diagram of a signal and data in case of a read operation about a high clock frequency of FIG. 5 according to a first preferred embodiment of the present invention.

Figure 1:
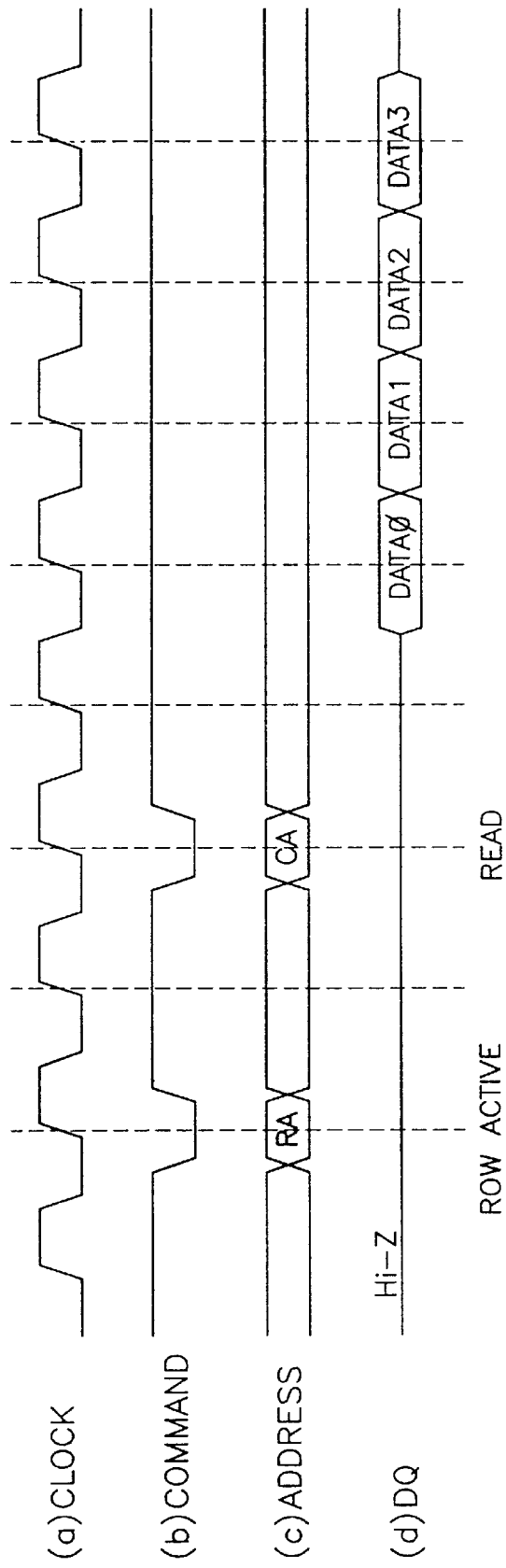
FIG. 1 is a timing diagram of a read operation in case of a burst length (BL)=4 and clock latency (CL)=2 according to the prior art.
Figure 2:
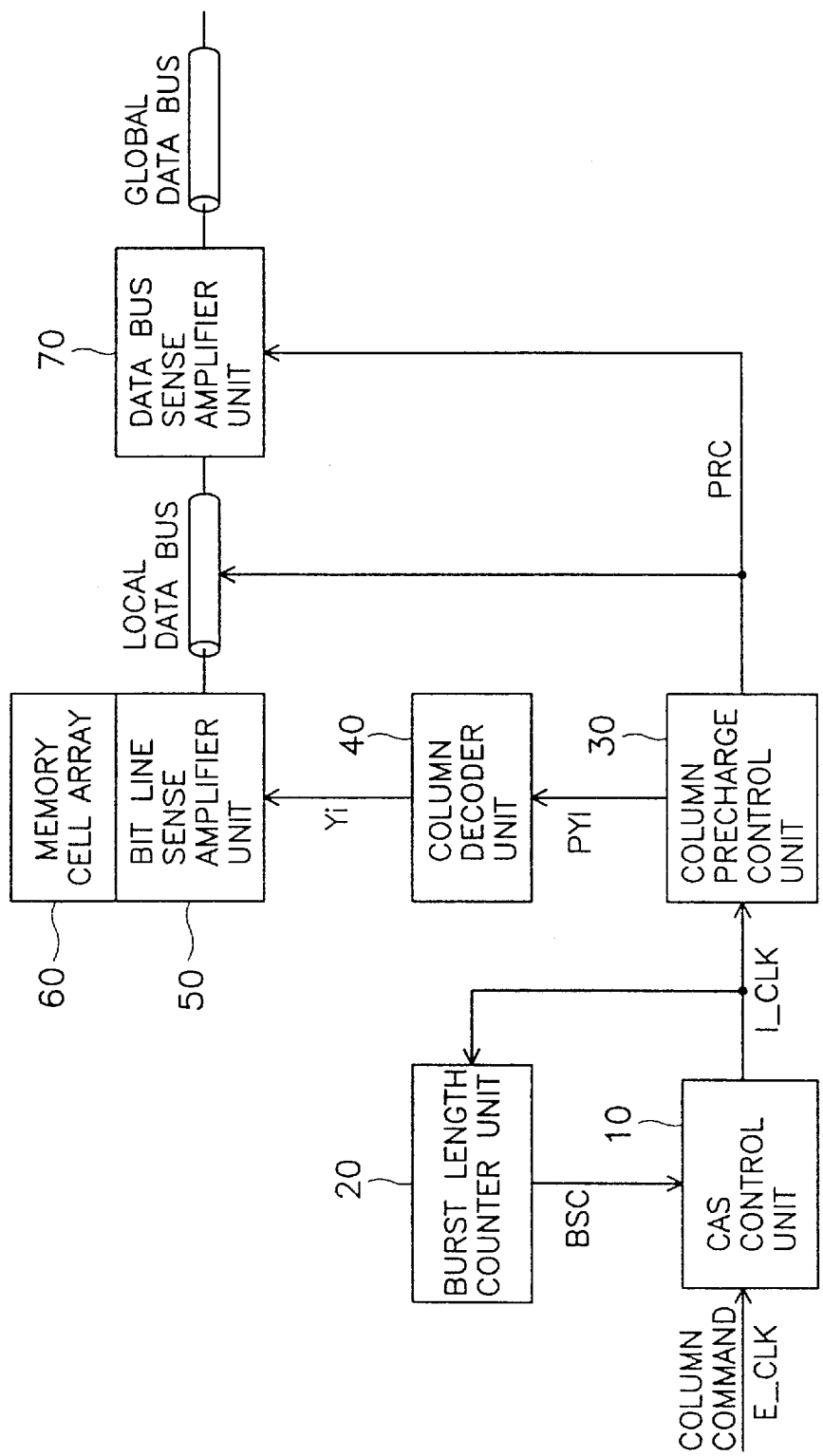
FIG. 2 is a block diagram of a semiconductor memory device related to a data bus for a read operation according to the prior art.
Figure 3:
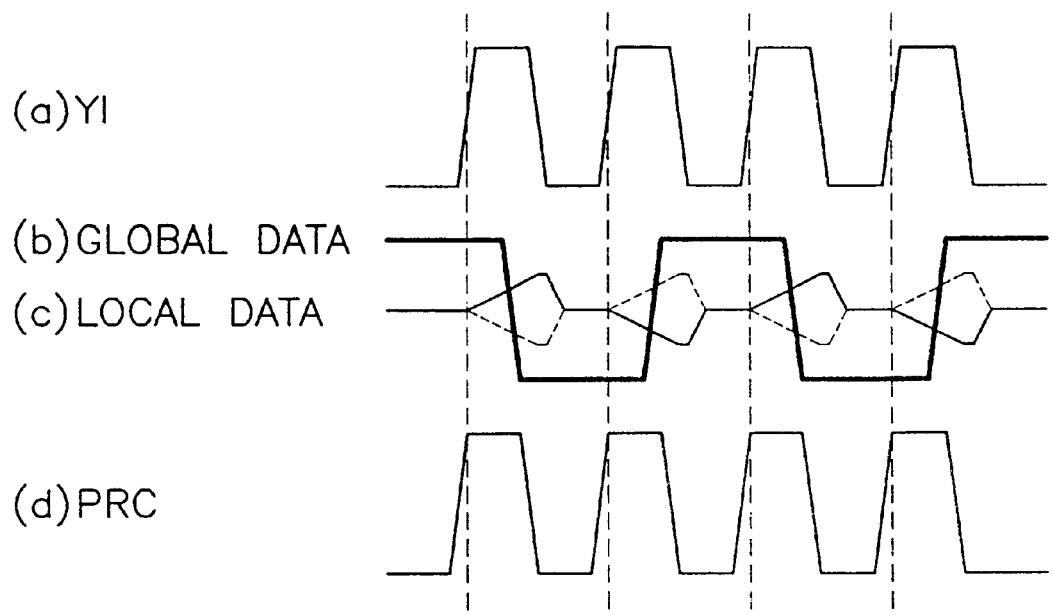
FIG. 3 is a timing diagram of a signal and data in case of a read operation about a low clock frequency of FIG. 2 according to the prior art.

Referring to FIG. 5, a column precharge control unit 130, a column decoder unit 40, and a data bus sense-amplifier unit 170 are different from those of FIG. 2, and a new signal FDB is added as compared with FIG. 2.

If a data of a bit line sense-amplifier unit 50 is loaded on a local data bus by a column decoder unit output signal Yi and is then sensed in a data bus sense-amplifier unit 170, the sensed data is generated from a global data bus at the same time that the signal FDB being a feedback signal is enabled, and a column decoder unit output signal Yi and a signal PRC are disabled in the column precharge control unit 130 and the column decoder unit 40. As a result, a local data bus is precharged with a precharge voltage Vprc, and a data bus sense-amplifier unit 170 of a precharge or standby state is obtained.

Figure 4:
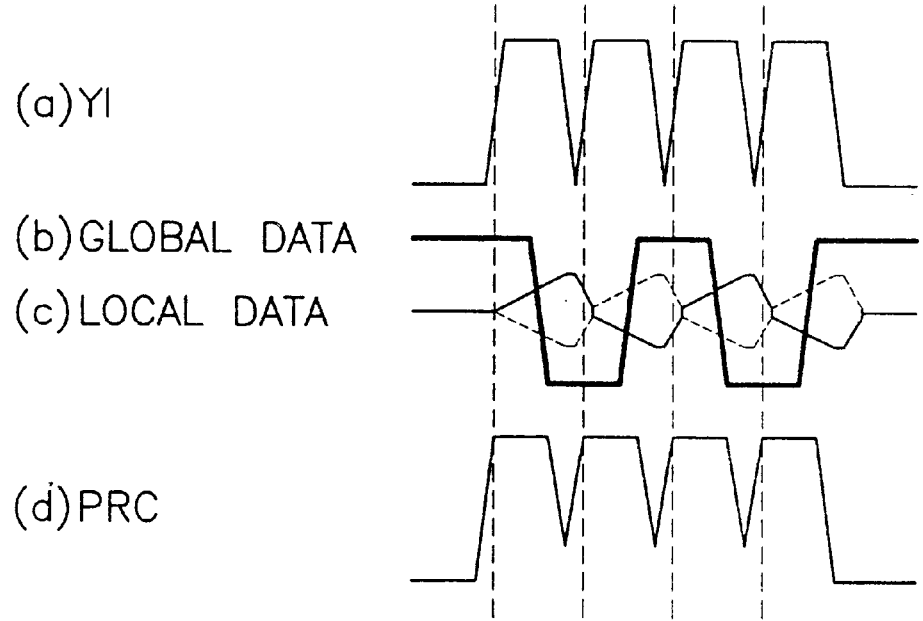
FIG. 4 is a timing diagram of a signal and data in case of a read operation about a high clock frequency of FIG. 2 according to the prior art.

FIG. 6 illustrates an output state of the local data Yi and PRC under the above state. In comparison with FIG. 4 using the same clock frequency, a semiconductor memory device of FIG. 5 can be operated at a faster clock frequency.

A data bus sense-amplifier unit 170 senses a data generated from a local data bus, then transmits the data to a global data bus, and generates a signal FDB differently from the prior data sense-amplifier unit 70 of FIG. 2. The signal FDB informs a state that a data generated from a local data bus is sensed and is then transmitted to a global data bus. That is, the signal FDB is provided to disable a column decoder unit output signal Yi after a data read operation, to precharge a local data bus with a signal PRC, and to make the data bus sense-amplifier unit 170 be at a precharge/standby state.

The column precharge control unit 130 receives an internal clock I_CLK, generates a signal PYI, and thus opens a bit line sense-amplifier unit 50 by using the column decoder output signal Yi. And, the column precharge control unit 130 prevents a precharge of the local data bus by using the signal PRC, and activates the data bus sense-amplifier unit 170. Thereafter, the data is transmitted to the global data bus, so that the signal FDB is enabled to control the signal PRC. Namely, the signal PYI is enabled by the internal clock I_CLK and is then automatically disabled. The signal PRC is enabled by the internal clock I_CLK and is then automatically disabled by the signal FDB. On the contrary, the signal PRC may be disabled by the internal clock I_CLK after being enabled by the signal FDB.

The column decoder unit 40 opens the bit line sense-amplifier unit 50 toward the local data bus because the column decoder unit output signal Yi is enabled by the signal PYI, and disables the column decoder unit output signal Yi by using the signal FDB, thereby the bit line sense-amplifier unit 50 is closed by the local data bus.

Figure 7:
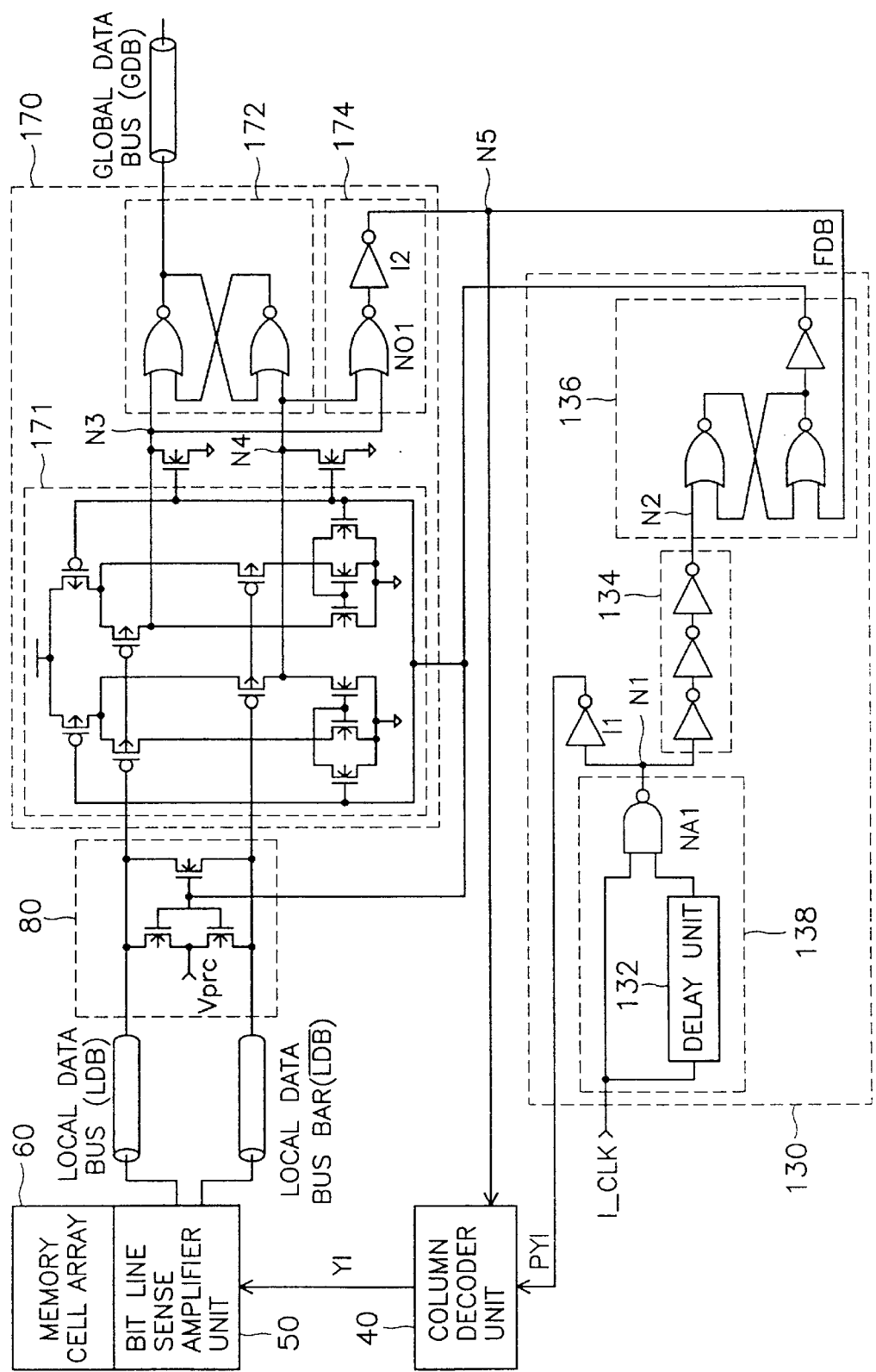
FIG. 7 is a detailed circuit diagram of a semiconductor memory device according to a first preferred embodiment of the present invention.
Figure 8:
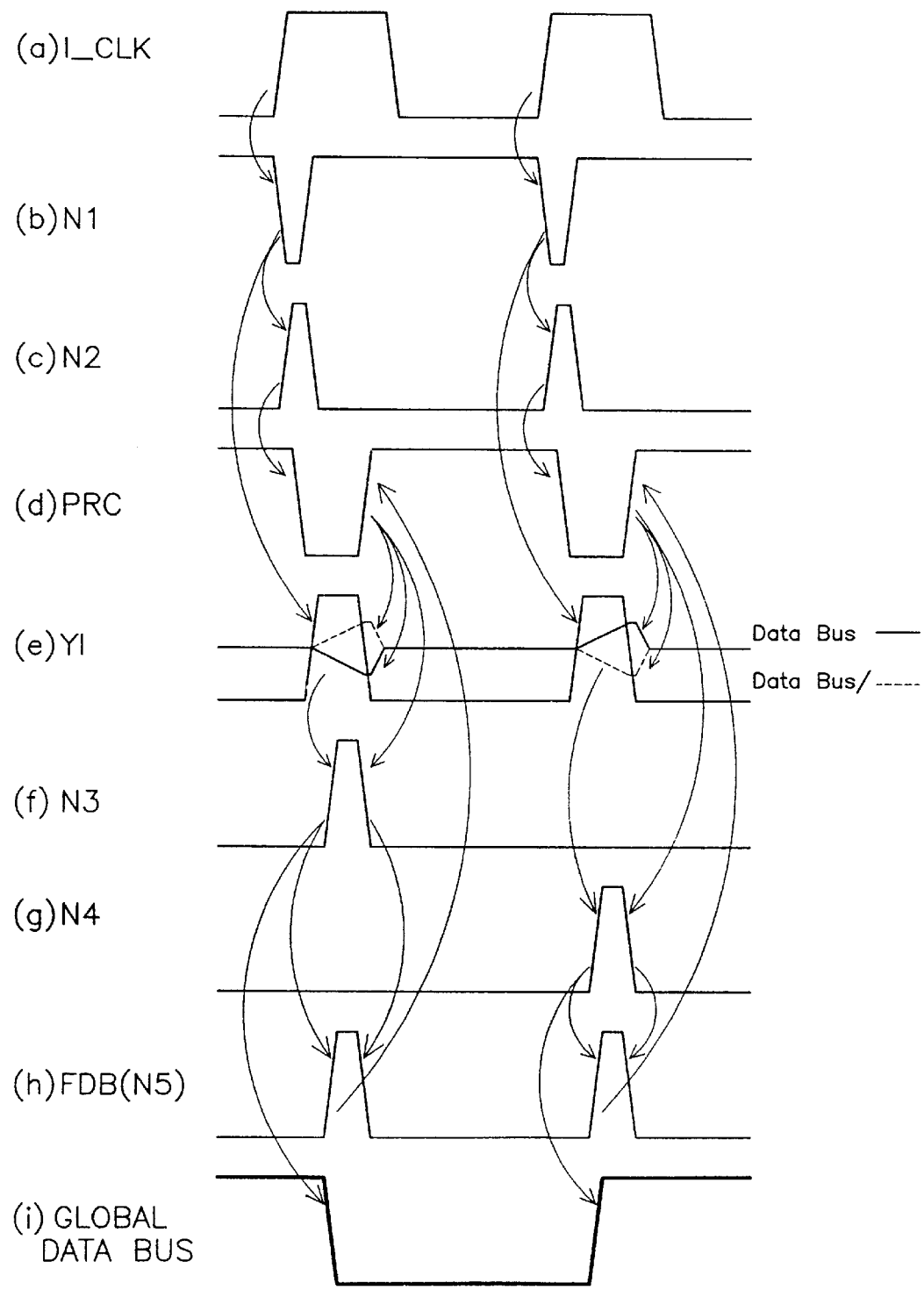
FIG. 8 is a timing diagram of a semiconductor memory device shown in FIG. 7.

FIG. 7 is a detailed circuit diagram of a semiconductor memory device according to a first preferred embodiment of the present invention; and FIG. 8 is a timing diagram of a semiconductor memory device shown in FIG. 7.

Referring to FIG. 7, a column precharge control unit 130 includes: edge signal generator unit 138 for generating an edge signal according to an internal clock I_CLK; a delay unit 134 for delaying the edge signal for a predetermined time; and a latch unit 136 for latching an output signal of the delay unit 134, and outputting a control signal PRC to the local data bus precharge circuit unit 80 and a data bus sense-amplifier unit 170.

The output signal of the edge signal generator unit 138 is transmitted to an inverter I1, and then a control signal PYI is transmitted to a column decoder unit 40.

The data bus sense-amplifier unit 170 includes: a latch unit 172 for latching a sensing amplified signal at nodes N3 and N4, and then outputting the sensing amplified signal to a global data bus; and a detection signal generator unit 174 which has a NOR gate NO1 and an inverter I2, and transmits a detection signal FDB to a column precharge control unit 130 according to a signal at the nodes N3 and N4.

In operation, if an internal clock I_CLK of a high state is input to the circuit of FIG. 7, a low pulse is generated on a node N1 by an output signal of a delay unit 132 and an input signal of NAND gate NA1. The signal of the node N1 is transmitted to an inverter I1 to generate a signal PYI, the signal PYI is input to a column decoder unit 40, so that a column decoder unit output signal Yi is enabled by the signal PYI not shown in FIG. 8.

The signal of the node N1 is transmitted to a delay unit 134, so that a high pulse is generated on a node N2. The number of inverters between the nodes N1 and N2 is an odd number so as to adjust a time lag of the column decoder unit output signal Yi.

By the high signal of the node N2, a latch unit 136 generates a signal PRC of a low state. A data of a bit line sense-amplifier unit 50 is loaded on a local data bus by the output signal Yi of the column decoder unit 40.

As shown in FIG. 8, let us suppose that the first data of a plurality of data loaded on the local data bus is at a low state, and the second data thereof is at a high state.

Namely, let us suppose that a first data bus line DB is at a low state, a first data bus line bar /DB is at a high state, a second data bus line DB is at a high state, and a second data bus line bar /DB is at a low state.

Since the first data bus DB is at a low state and a data bus /DB is at a high state, a signal of a high state is made on a node N3 of the data bus sense-amplifier unit 170, and a signal of a low state is made on a node N4, therefore, there is no phase variation. However, since the nodes N3 and N4 are input to a NOR gate of the detection signal generator unit 174, the signal FDB is at a high state if a high level signal is made on either one between two nodes N3 and N4.

Since a high level signal of the node N3 is input to a latch unit 172, a low data is loaded on a global data bus, and the signal FDB is at a high state by an output signal of a detection signal generator unit 174. In case that the high level signal FDB passes through a column precharge control unit 130 and a signal PRC is at a high state, a local data bus is precharged with a precharge voltage Vprc, the signal PRC being input to a sensing amplifier unit 171 of a data bus sense-amplifier unit 170 precharges the nodes N3 and N4, and makes the data bus sense-amplifier unit 170 be at a standby state simultaneously with making the signal FDB be at a low state.

Since the second data bus DB by a second signal Yi is at a high state and a data bus /DB is at a low state, a signal of a node N4 is at a high state, and a signal of a node N3 is at a low state, therefore, there is no phase variation.

As described above, if a data is generated from a global data bus, this means that the data is latched. At this time, the present invention disables an unnecessary signal until the next data is generated, and precharges a local data bus and a data bus sense-amplifier unit 170, thereby effectively performing a read operation. In FIG. 5, since a bit line sense-amplifier unit 50 as many as a data number predetermined by a column decoder output signal Yi generated from the column decoder unit 40 is opened, the data simultaneously passes through a local data bus as many as the predetermined data number, a data bus sense-amplifier unit 170, and a global data bus. Accordingly, CAS control unit 10, a burst length counter unit 20, and a column precharge control unit 130 are commonly used. A column decoder unit 40 can be changed according to a column address and a chip structure. A bit line sense-amplifier unit 50 and a memory cell array 60 can be changed according to a cell or core structure. The local data bus, a data bus sense-amplifier unit 170, and a global data bus can be changed according to a bus type, a chip structure, and a burst operation method. And, each number of the local data bus, the data bus sense-amplifier unit 170, and the global data bus are identical with a maximum data number readable at the same time, or is beyond the maximum data number.

The column precharge control unit 130 uses the same signal as two signals PRC, i.e., one signal PRC transmitted to the local data bus and the other signal PRC going to the data bus sense-amplifier unit 170, and also makes two signals PRC different. The column precharge control unit 130 uses the same signal as each signal PRC going to each local data bus, and makes the signals PRC different. Also, the column precharge control unit 130 uses the same signal as each signal PRC going to each data bus sense-amplifier unit 170, and makes the signals PRC different.

A signal FDB being input to the column precharge control unit 130 from the data bus sense-amplifier unit 170 can commonly use a plurality of signals FDB generated from a plurality of data bus sense-amplifier unit 170, or each of the signals FDB can be individually used. Although a plurality of the data bus sense-amplifier units 170 making the signal FDB can be simultaneously used, only one data bus sense-amplifier unit among the data bus sense-amplifier units 170 can be used.

By an inverter, a NAND gate, NOR gate or another circuit which are positioned at a center part of signals used in the above, a buffering operation can be performed. For example, when a local data bus is precharged by receiving a signal PRC generated from the column precharge control unit 130, the signal PRC is not directly applied to the local data bus, and is applied to the local data bus after being buffered by the inverter, NAND gate, NOR gate or another circuit.

Figure 9:
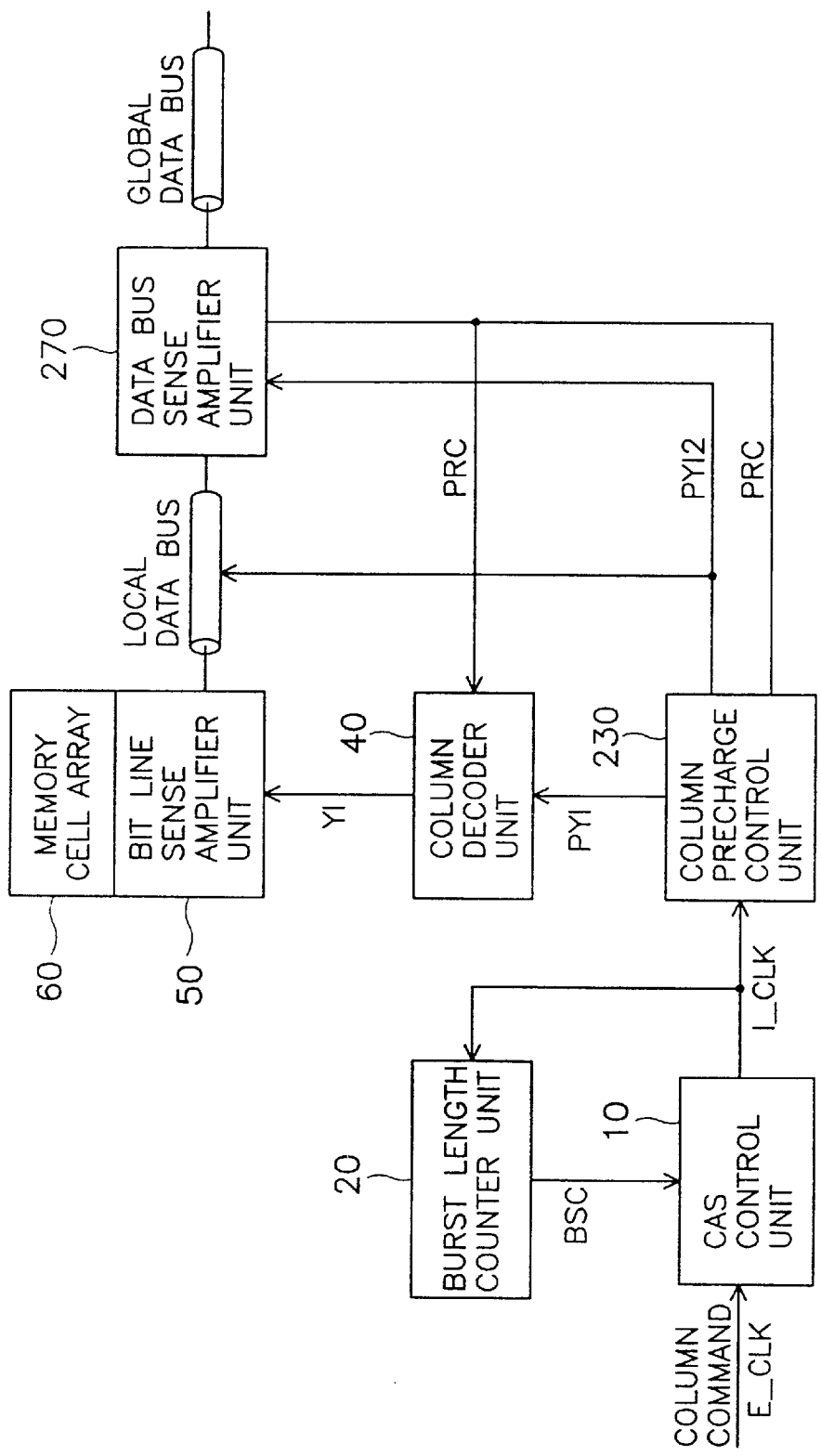
FIG. 9 is a block diagram of a semiconductor memory device related to a data bus for a read operation according to a second preferred embodiment of the present invention.
Figure 10:
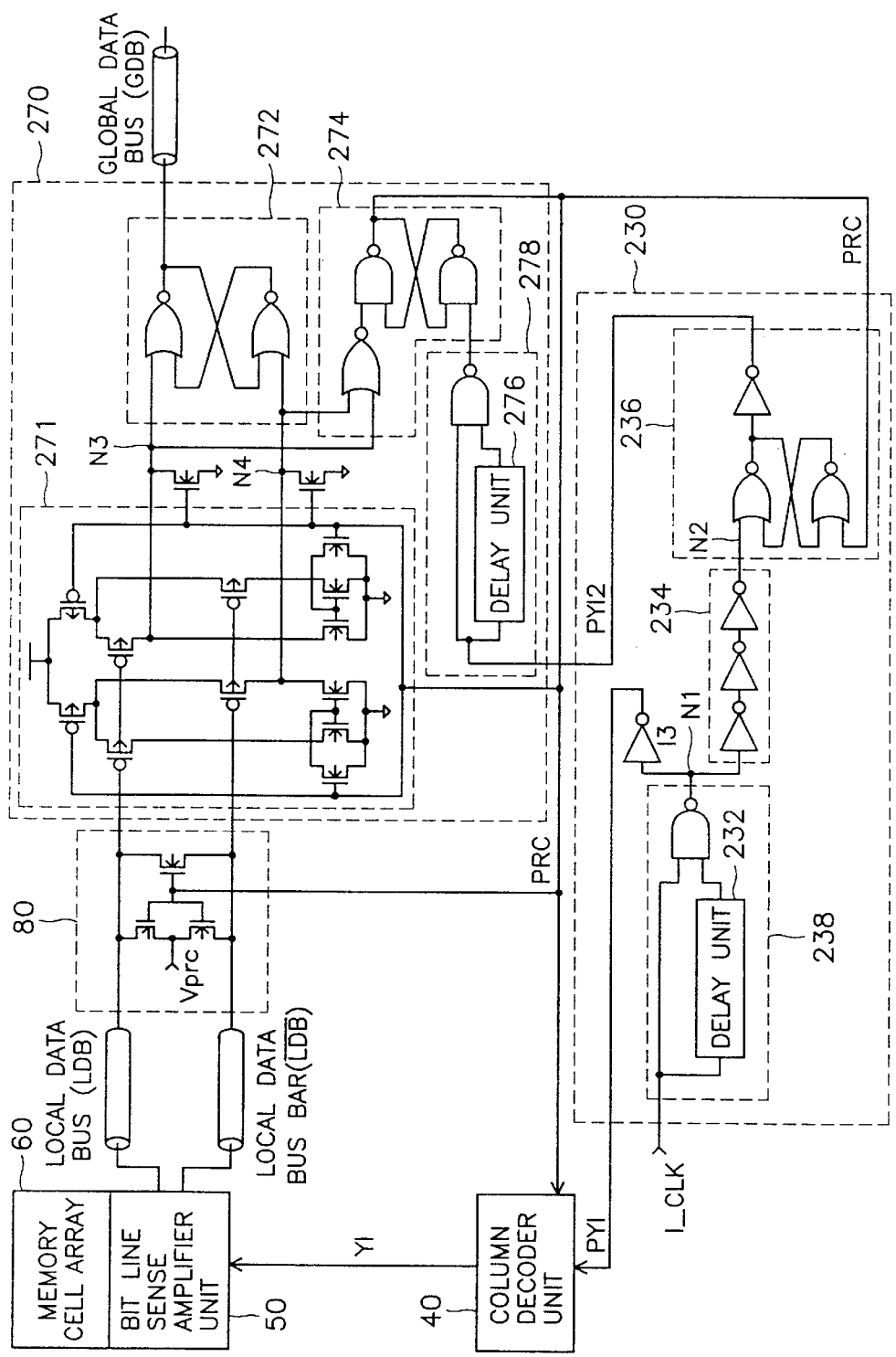
FIG. 10 is a detailed circuit diagram of a semiconductor memory device according to a second preferred embodiment of the present invention.

FIG. 9 is a block diagram of a semiconductor memory device related to a data bus for a read operation according to a second preferred embodiment of the present invention; and FIG. 10 is a detailed circuit diagram of a semiconductor memory device according to a second preferred embodiment of the present invention.

In FIGS. 9–10, a column precharge control unit 230 and a data bus sense-amplifier unit are different from those of FIG. 5. A signal PYI2 is used in place of the signal PRC. On behalf of the signal FDB, a signal PRC is generated from the data bus sense-amplifier unit 270. As a result, a column precharge control unit 230, a column decoder unit 40, and a local data bus are precharged and are at a standby state.

Referring to FIG. 10, the column precharge control unit 230 includes: an edge signal generator unit 238 for generating an edge signal; a delay unit 234 for delaying the edge signal for a predetermined time; and a latch unit 236 for latching an output signal of the delay unit 234, and outputting a signal PYI2 to a data bus sense-amplifier unit 270. The output signal of the edge signal generator unit 238 passes through an inverter I3, and outputs a signal PYI to a column decoder unit 40. A reference numeral 271 indicates a sense-amplifier unit for sensing a signal of a local data bus and amplifying it.

The data bus sense-amplifier unit 270 includes: a latch unit 272 for latching a sensing signal amplified by the sense-amplifier unit 271 at output nodes N3 and N4, and outputting the signal to a global data bus; an edge signal generator unit 278 which has a delay unit 276, and generates an edge signal by a signal PYI2 of the latch unit 236; and a detection signal generator unit 274 for transmitting a signal PRC to a column decoder unit 80, a local bus precharge circuit unit 80, and a column precharge control unit 130 according to the edge signal and the signals of the nodes N3 and N4.

In FIG. 10, since a bit line sense-amplifier unit 50 as many as a data number predetermined by a column decoder output signal Yi generated from the column decoder unit 40 is opened, the data simultaneously passes through a local data bus as many as the predetermined data number, a data bus sense-amplifier unit 270, and a global data bus. Accordingly, CAS control unit 10, a burst length counter unit 20, and a column precharge control unit 30 are commonly used. A column decoder unit 40 can be changed according to a column address and a chip structure. A bit line sense-amplifier unit 50 and a memory cell array 60 can be changed according to a cell or core structure. The local data bus, a data bus sense-amplifier unit 270, and a global data bus can be changed according to a bus type, a chip structure, and a burst operation method. And, each number of the local data bus, the data bus sense-amplifier unit 270, and the global data bus are identical with a maximum data number readable at the same time, or is beyond the maximum data number.

The data bus sense-amplifier unit 270 uses the same signal as three signals PRC, i.e., a first signal PRC going to the local data bus, a second signal PRC going to the column decoder unit 40, and a third signal PRC going to a column precharge control unit 230, and also makes three signals PRC different. The data bus sense-amplifier unit 270 uses the same signal as each signal PRC going to each local data bus, and makes the signals PRC different.

The signal PRC being input to the column precharge control unit 230 from the data bus sense-amplifier unit 270 can commonly use a plurality of signals PRC generated from the data bus sense-amplifier unit 270, or each of the signals PRC can be individually used. Although a plurality of the data bus sense-amplifier units 270 making the signal PRC can be simultaneously used, only one data bus sense-amplifier among the data bus sense-amplifier units 270 can be used.

By an inverter, a NAND gate, NOR gate or another circuit which are positioned at a center part of signals used in the above, a buffering operation can be performed. For example, when a local data bus is precharged by receiving a signal PRC generated from the data bus sense-amplifier unit 270, the signal PRC is not directly applied to the local data bus, and is applied to the local data bus after being buffered by the inverter, NAND gate, NOR gate or another circuit.

Figure 11:
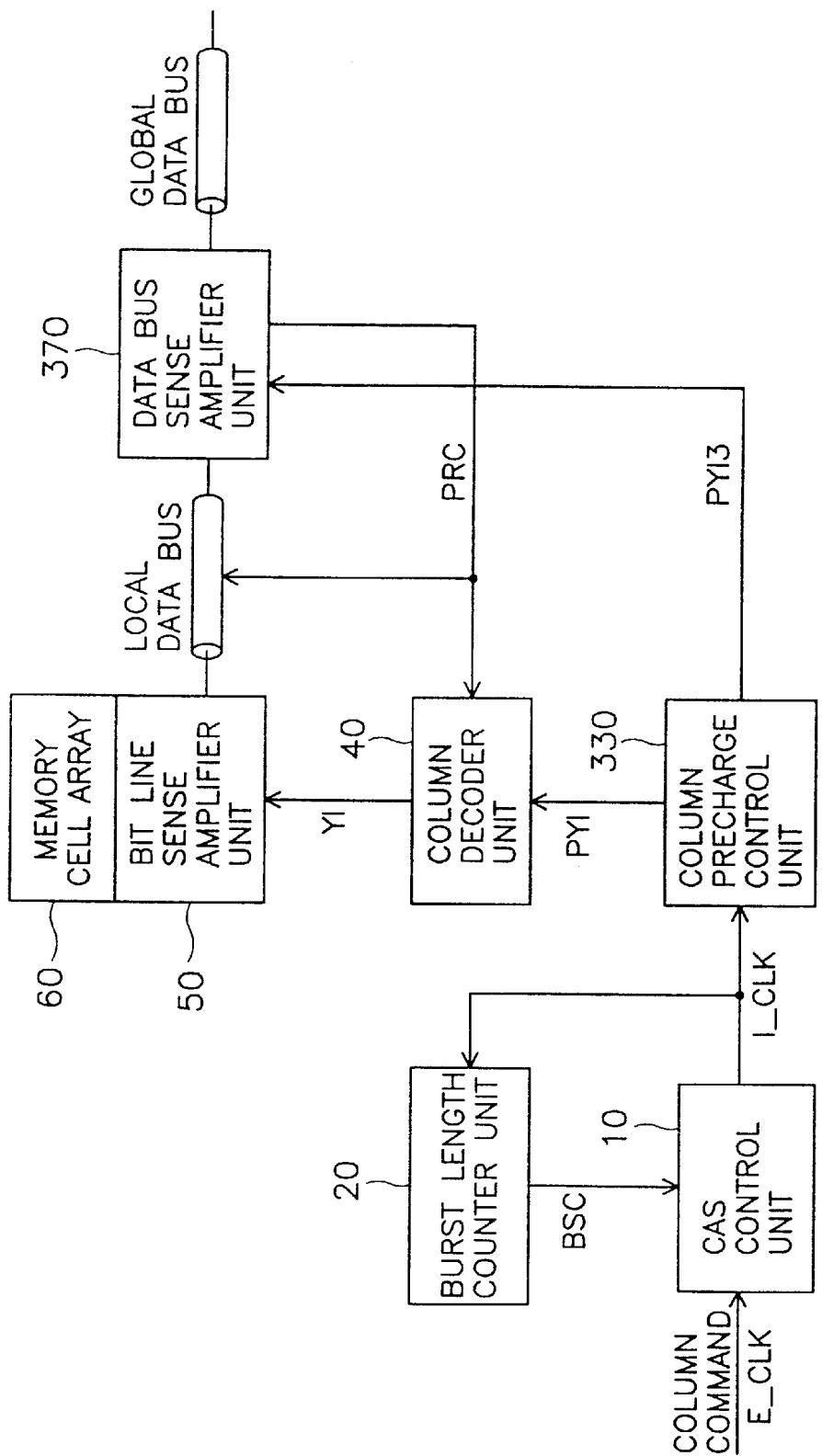
FIG. 11 is a block diagram of a semiconductor memory device related to a data bus for a read operation according to a third preferred embodiment of the present invention.
Figure 12:
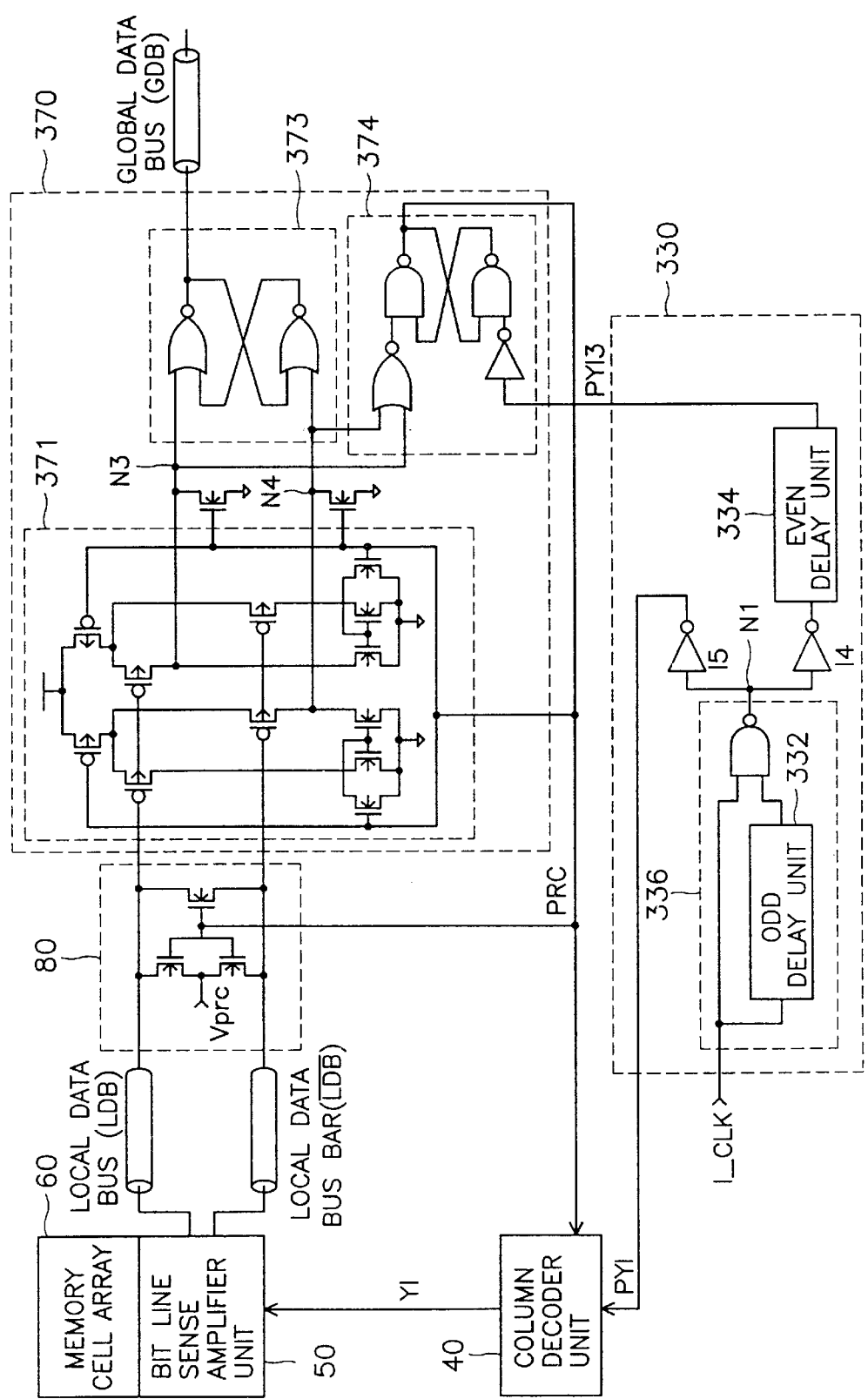
FIG. 12 is a detailed circuit diagram of a semiconductor memory device according to a third preferred embodiment of the present invention.

FIG. 11 is a block diagram of a semiconductor memory device related to a data bus for a read operation according to a third preferred embodiment of the present invention; and FIG. 12 is a detailed circuit diagram of a semiconductor memory device according to a third preferred embodiment of the present invention.

A column precharge control unit 330 and a bus sense-amplifier unit 370 are different from those of FIG. 9. A signal PYI3 is used in place of the signal PYI2. A signal PRC generated from the data bus sense-amplifier unit 370 is not input to a column precharge control unit 330.

Referring to FIG. 12, a column precharge control unit 330 includes: an edge signal generator unit 336 for generating an edge signal according to an internal clock I_CLK; and even delay unit 334 for delaying the edge signal for a predetermined time by an inverter I4, and outputting the edge signal to a data bus sense-amplifier unit 370. The output signal of the edge signal generator unit 336 passes through an inverter I5, and outputs a signal PYI to a column decoder unit 40.

The data bus sense-amplifier unit 370 includes: a sensing amplifier unit 371 for amplifying a signal generated from a local data bus; a latch unit for latching a sensing amplified signal, and outputting the signal to a global data bus; a detection signal generator unit 374 for latching the sensing amplified signal and a signal PYI3 of a column precharge control unit 330, and inputs a signal PRC to the sensing amplifier unit 371, a local data bus precharge circuit unit 80, and a column decoder unit 40.

In FIG. 12, since a bit line sense-amplifier unit 50 as many as a data number predetermined by a column decoder unit output signal Yi generated from the column decoder unit 40 is opened, the data simultaneously passes through a local data bus as many as the predetermined data number, a data bus sense-amplifier unit 370, and a global data bus. Accordingly, CAS control unit 10, a burst length counter unit. 20, and a column precharge control unit 330 are commonly used. A column decoder unit 40 can be changed according to a column address and a chip structure. A bit line sense-amplifier unit 50 and a memory cell array 60 can be changed according to a cell or core structure. The local data bus, a data bus sense-amplifier unit 370, and a global data bus can be changed according to a bus type, a chip structure, and a burst operation method. And, each number of the local data bus, the data bus sense-amplifier unit 370, and the global data bus are identical with a maximum data number readable at the same time, or is beyond the maximum data number.

The data bus sense-amplifier unit 370 uses the same signal as two signals PRC, i.e., a first signal PRC going to the local data bus and a second signal PRC going to the column decoder unit 40, and also makes two signals PRC different. The data bus sense-amplifier unit 370 uses the same signal as each signal PRC going to each local data bus, and makes the signals PRC different.

Although a plurality of the data bus sense-amplifier units 370 making the signal PRC can be simultaneously used, only one data bus sense-amplifier among the data bus sense-amplifier units 370 can be used.

By an inverter, a NAND gate, NOR gate or another circuit which are positioned at a center part of signals used in the above, a buffering operation can be performed. For example, when a local data bus is precharged by receiving a signal PRC generated from the data bus sense-amplifier unit 370, the signal PRC is not directly applied to the local data bus, and is applied to the local data bus after being buffered by the inverter, NAND gate, NOR gate or another circuit.

As described above, a semiconductor memory device according to the present invention feeds back a signal made by detecting a data sensing when reading a memory chip, precharges a local data bus within a short time, performs a high-speed operation, and enhances a burst characteristic and AC characteristic responsive to the burst characteristic.

It is understood that various other modifications will be apparent to and can be readily made by those skilled in the art without departing from the scope and spirit of this invention. Accordingly, it is not intended that the scope of the claims appended hereto be limited to the description as set forth herein, but rather that the claims be construed as encompassing all the features of patentable novelty that reside in the present invention, including all features that would be treated as equivalents thereof by those skilled in the art which this invention pertains.

What is claimed is:

1. In a semiconductor memory device which senses a data signal transmitted from a local data bus during a read operation by using a data bus sense-amplifier means, and then outputs the data signal to a global data bus, a semiconductor memory device, comprising:

a data bus sense-amplifier output detector means which is included in the data bus sense-amplifier means, performs a logic operation about the data signal sensed by the data bus sense-amplifier menans, and generates a detection signal; and a column precharge control menans for generating a control signal to precharge the local data bus and the data bus sense-amplifier means according to the detection signal from the data bus sense-amplifier output detector means.

2. A semiconductor memory device as set forth in claim 1, wherein the data bus sense-amplifier output detector means comprises:

a NOR gate for receiving an output signal of the data bus sense-amplifier means as an input; and an inverter for outputting a control signal to the column precharge controller according to an output signal of the NOR gate.

3. A semiconductor memory device as set forth in claim 1, wherein the data bus sense-amplifier output detector means inputs a control signal into a column decoder means, simultaneously with inputting a control signal into the column precharge control means.

4. A semiconductor memory device as set forth in claim 1, wherein the data bus sense-amplifier includes at least one latch means for latching a previous data until the next data is generated on an output terminal of the data bus sense-amplifier means.

5. A semiconductor memory device as set forth in claim 3, wherein the column precharge control means comprises:

an edge signal generator means which includes a first delay means having odd number inverters of delaying an input internal clock, and a NAND gate for performing a NAND operation about an output signal of the first delay means and the internal clock, and generating an edge signal;

a second delay means having inverters of odd number, for being connected to an output terminal of the edge signal generator means, and delaying an output signal for a predetermined time;

an inverter which is connected to an output terminal of the edge signal generator means, and outputs a control signal to a column decoder means; and a latch means for latching an output signal of the second delay means and another input signal, and outputting a control signal to the local data bus and the data bus sense-amplifier means.

6. In a semiconductor memory device which senses a data signal transmitted from a local data bus during a read operation by using a data bus sense-amplifier means, and then outputs the data signal to a global data bus, a semiconductor memory device, comprising:

a data bus sense-amplifier output detector means which is included in the data bus sense-amplifier means, performs a logic operation about the data signal sensed by the data bus sense-amplifier means, and generates a detection signal; and a column precharge control means for outputting a control signal to the data bus sense-amplifier means according to the detection signal from the data bus sense-amplifier means, wherein the detection signal is fed back to the local data bus and the data bus sense-amplifier means as a precharge signal.

7. A semiconductor memory device as set forth in claim 6, wherein the data bus sense-amplifier means comprises:

a delay means for delaying a control signal of the column precharge control means for a predetermined time; and an edge signal generator means for performing NAND operation about the delayed signal and the control signal, and outputting an edge signal to the data bus sense-amplifier output detector means.

8. A semiconductor memory device as set forth in claim 7, wherein the data bus sense-amplifier output detector means comprises:

NOR gate for receiving an output signal of the data bus sense-amplifier means as an input; and a latch means for latching the edge signal and an output signal of the NOR gate, and outputting a detection signal to the column precharge control means.

* * * * *